(12) United States Patent
Govindaraju et al.

(10) Patent No.: US 9,704,798 B2
(45) Date of Patent: Jul. 11, 2017

(54) USING MATERIALS WITH DIFFERENT ETCH RATES TO FILL TRENCHES IN SEMICONDUCTOR DEVICES

(71) Applicant: Intel Corporation, Santa Clara, CA (US)

(72) Inventors: Sridhar Govindaraju, Hillsboro, OR (US); Anindya Dasgupta, Portland, OR (US); Rohit Grover, West Linn, OR (US)

(73) Assignee: Intel Corporation, Santa Clara, CA (US)

( * ) Notice: Subject to any disclaimer, the term of this patent is extended or adjusted under 35 U.S.C. 154(b) by 22 days.

(21) Appl. No.: 14/137,497

(22) Filed: Dec. 20, 2013

(65) Prior Publication Data

US 2015/0179567 A1 Jun. 25, 2015

(51) Int. Cl.
*H01L 21/768* (2006.01)
*H01L 23/522* (2006.01)
*H01L 23/532* (2006.01)
*H01L 23/485* (2006.01)

(52) U.S. Cl.
CPC .... *H01L 23/5226* (2013.01); *H01L 21/76865* (2013.01); *H01L 21/76877* (2013.01); *H01L 23/485* (2013.01); *H01L 23/53223* (2013.01); *H01L 23/53238* (2013.01); *H01L 23/53266* (2013.01); *H01L 21/76804* (2013.01); *H01L 21/76831* (2013.01); *H01L 2924/0002* (2013.01)

(58) Field of Classification Search
None
See application file for complete search history.

(56) References Cited

U.S. PATENT DOCUMENTS

| 7,867,891 | B2 | 1/2011 | O'Brien | |
|---|---|---|---|---|
| 8,508,018 | B2 | 8/2013 | Akolkar | |
| 2005/0037613 | A1* | 2/2005 | Grunow | H01L 21/76856 438/643 |
| 2008/0171442 | A1* | 7/2008 | Wu | H01L 21/76804 438/702 |
| 2012/0070982 | A1* | 3/2012 | Yu | H01L 21/2855 438/653 |
| 2013/0005140 | A1* | 1/2013 | Jeng | H01L 21/28556 438/653 |
| 2013/0035272 | A1* | 2/2013 | Lee | C11D 7/3209 510/176 |

OTHER PUBLICATIONS

U.S. Appl. No. 13/730,184, filed Dec. 28, 2012 entitled "Cobalt Based Interconnects and Methods of Fabrication Thereof" by Jezewski, et al.

* cited by examiner

*Primary Examiner* — Calvin Choi
*Assistant Examiner* — Xiaoming Liu
(74) *Attorney, Agent, or Firm* — Trop, Pruner & Hu, P.C.

(57) ABSTRACT

An embodiment includes a metal interconnect structure, comprising: a dielectric layer on a substrate; an opening in the dielectric layer, wherein the opening has opening sidewalls and exposes a conductive region of at least one of the substrate and an additional interconnect structure; a first atomic layer deposition (ALD) layer on the conductive region and the opening sidewalls; a second ALD layer on a portion of the first ALD layer, and a third ALD layer within the opening and on the first ALD layer. Other embodiments are described herein.

25 Claims, 4 Drawing Sheets

USING MATERIALS WITH DIFFERENT ETCH RATES TO FILL TRENCHES IN SEMICONDUCTOR DEVICES

TECHNICAL FIELD

Embodiments of the present invention relate generally to metal interconnect structures and their methods of fabrication.

BACKGROUND

Once semiconductor wafers are prepared, a large number of process steps are still necessary to produce desired semiconductor integrated circuits. In general the steps can be grouped into four areas: Front End Processing, Back End Processing, Test, and Packaging.

Front End Processing refers to the initial steps in the fabrication. In this stage the actual semiconductor devices (e.g., transistors) are created. A typical front end process includes: preparation of the wafer surface, patterning and subsequent implantation of dopants to obtain desired electrical properties, growth or deposition of a gate dielectric, and growth or deposition of insulating materials to isolate neighboring devices.

Once the semiconductor devices have been created they must be interconnected to form the desired electrical circuits. This "Back End Processing" involves depositing various layers of metal and insulating material in the desired pattern. Typically the metal layers consist of aluminum, copper, and the like. The insulating material may include $SiO_2$, low-K materials, and the like. The various metal layers are interconnected by interconnects, which may include a line portion and a via portion. Vias may be formed by etching holes in the insulating material and depositing metal (e.g., Tungsten) in them. The line portion may be formed by etching trenches in the insulating material and depositing metal in them.

Once the Back End Processing has been completed, the semiconductor devices are subjected to a variety of electrical tests to determine if they function properly. Finally, the wafer is cut into individual die, which are then packaged in packages (e.g., ceramic or plastic packages) with pins or other connectors to other circuits, power sources, and the like.

DETAILED DESCRIPTION

Reference will now be made to the drawings wherein like structures may be provided with like suffix reference designations. In order to show the structures of various embodiments more clearly, the drawings included herein are diagrammatic representations of semiconductor/circuit structures. Thus, the actual appearance of the fabricated integrated circuit structures, for example in a photomicrograph, may appear different while still incorporating the claimed structures of the illustrated embodiments. Moreover, the drawings may only show the structures useful to understand the illustrated embodiments. Additional structures known in the art may not have been included to maintain the clarity of the drawings. For example, not every layer of a semiconductor device is necessarily shown. "An embodiment", "various embodiments" and the like indicate embodiment(s) so described may include particular features, structures, or characteristics, but not every embodiment necessarily includes the particular features, structures, or characteristics. Some embodiments may have some, all, or none of the features described for other embodiments. "First", "second", "third" and the like describe a common object and indicate different instances of like objects are being referred to. Such adjectives do not imply objects so described must be in a given sequence, either temporally, spatially, in ranking, or in any other manner. "Connected" may indicate elements are in direct physical or electrical contact with each other and "coupled" may indicate elements co-operate or interact with each other, but they may or may not be in direct physical or electrical contact.

Figure 1A:
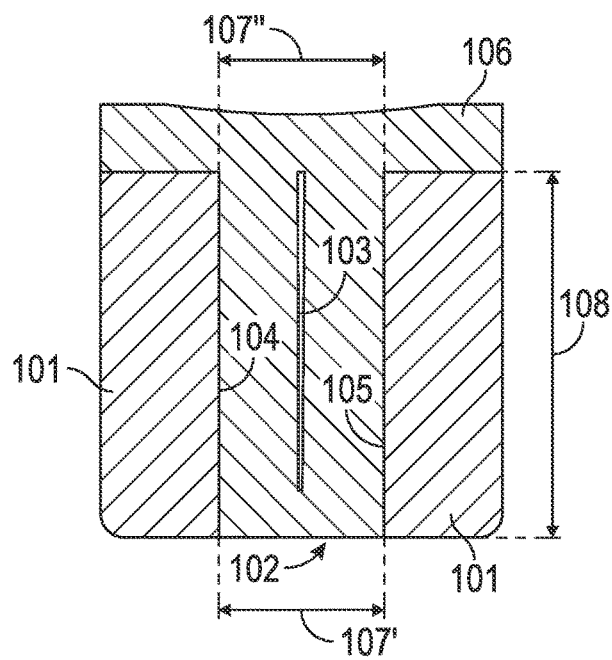
FIGS. 1A-1B are cross-sectional side view illustrations of a conventional method of forming interconnects.

Shrinking pitches (i.e., center-to-center distance between features of an integrated circuit such as interconnect lines) have made it difficult to fill trenches with no void or seam. For example, FIG. 1A includes trench 102 defined by sidewalls 104, 105 of dielectric portions 101. Trench 102 is rather idyllic considering it has perfectly vertical sidewalls 104, 105 (i.e., the bottom of the trench has a width 107' equal to the width 107" at the top of the trench). Even with perfectly vertical sidewalls 104, 105 certain techniques, such as atomic layer deposition (ALD), still form a film 106 with a seam 103. This occurs because the conformal deposition technique (which forms film 106 on the bottom and sidewalls of the trench simultaneously) closes the width of the trench more quickly than it closes the height 108 of the trench because physical transport limits film growth rates in high-aspect ratio structures. This problem is exacerbated with increasing aspect ratio (trench height:trench width ratio) trenches/interconnects, which are more and more common with decreasing pitch technologies.

Figure 1B:
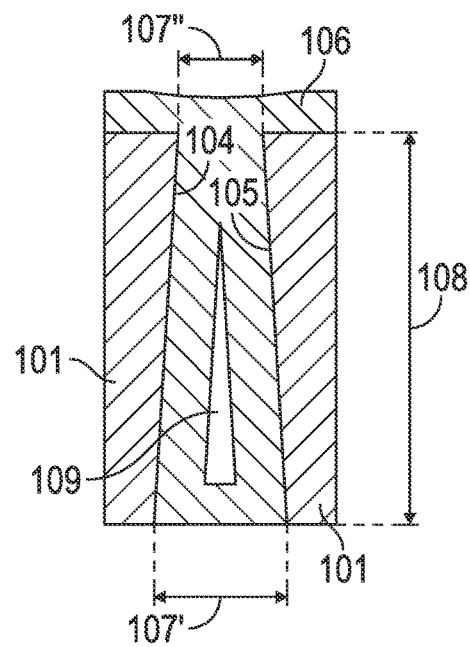

Problems also exist with non-idyllic trench forms, such as the "top tapered" trench 102 of FIG. 1B. Trench 102 is "top tapered" considering its sidewalls 104, 105 pinch inwards as they go upwards, resulting in a top trench opening width 107" that is narrower than the bottom trench opening width 107'. Due to the taper, the ALD film conforms to the sidewalls and more quickly closes the narrower width 107" than wider width 107'. This unequal rate of closure creates void 109. Various undesired materials can form within void 109. For example, a metal may form with in void 109 and lead to a short.

These seam and void problems are not limited to ALD processes. For example, continuous chemical vapor deposition (CVD) etch schemes were used to fill trenches in 45 nm and larger pitch technologies. However, with technologies using a minimum pitches less than or equal to 32 nm a CVD process leaves behind voids as described above because CVD, like ALD, is a conformal processed whereby the CVD film closes the width of a high aspect ratio trench more quickly than it fills the height of such a trench. CVD based processes are more prone to "bread-loafing" effects on the top of the trenches which exacerbates void formations. A bread loafing effect describes the situation where the film actually emerges as a mound or rise above the trench in a manner similar to how bread or a muffin may rise above a bread pan's upper surface. Thus, the film's upper portion extends above the trench and is possibly wider than the top width of the trench.

There have been further applications of liquid based fills which can be further treated to form void free trenches, but these are not films that can withstand harsh wet etches and dry etch processes. For the case of films deposited using liquid precursors, although void-free films are possible due to the nature of these processes, such films must typically be cured by exposure to ultraviolet radiation or high temperatures (in excess of 150 degrees C.) to render them chemically stable, failing which subsequent chemical treatments may completely remove the thin film. Treatments used for film curing (if available) typically result in film shrinkage, wafer warpage, and in extreme cases, an undesirable change to device properties—all of which can be detrimental to further semiconductor processing.

In contrast, an embodiment provides for the use of well-understood, chemically stable materials deposited in standard thin film deposition equipment. "Chemically stable", as used herein, means the ability to use standard chemical treatments (e.g., dilute acidic or basic cleans and plasma etches or cleans) for downstream processing without significant loss of the thin film that is desired to be retained.

In further contrast, an embodiment includes a technique to use a desired ALD film to fill trenches without any seam or void, or if there is such a seam or void it is greatly diminished in comparison with the seams or voids produced with conventional techniques.

An embodiment includes deposition of a multilayer ALD film (liner) where each of the layers has a controlled thickness. The film is deposited in an interconnect (e.g., trench) and initially forms an intentional 1-5 nm wide seam. Subsequently a controlled dry etch is performed on the multilayer ALD film. The multilayer ALD film includes a bottom layer and a top layer formed on the bottom layer. There may be zero or many other layers between the bottom and top ALD layers. The bottom ALD layer acts as an etch stop layer and its dry etch rate is appreciably less or negligible compared to the top ALD layer. The dry etch creates a V-shaped profile (i.e., "bottom tapered" in contrast to the "top tapered" profile described in relation to FIG. 1B above) in the trench with the top ALD film getting etched more significantly than the bottom layer considering its materials have a faster etch rate than the materials of the bottom ALD layer. Thus, little to none of the top ALD layer is left while leaving behind some of the bottom ALD film. This results in a V-shaped trench (where the bottom is narrower than the top) that has a profile that has "flipped" or is the opposite of the "top tapered" trench that existed before any deposition of any layer of the ALD film (and would result in a bottom tapered profile even if the original trench has no tapering or bottom tapering). The V-shaped trench profile promotes a bottom-up filling of material of any subsequent ALD film to completely (or almost completely) fill up the trench. In an embodiment any chemical composition of the ALD films used in the multilayer ALD liner can be selected to operate with any corresponding dry etch chemistry as long as the bottom ALD layer acts as an etch stop layer, while the top ALD film is etched away (fully or partially). This process can be used to deposit void/seam free ALD films in any of various trench shapes, such as "top tapered" (narrower at top than bottom), "bottom tapered" (narrower at bottom than top), and vertical (non-tapered) trenches.

Figure 2A:
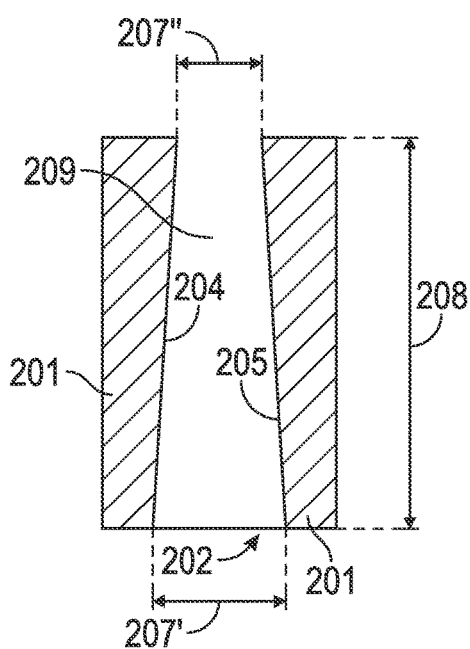
FIGS. 2A-E are cross-sectional side-view illustrations of a method of forming interconnects in an embodiment of the invention.

FIGS. 2A-E are cross-sectional side-view illustrations of a method of forming interconnects in an embodiment of the invention In FIG. 2A a top tapered trench 202 is formed within dielectric 201. The bottom of the trench width 207' is wider than the top of the trench width 207". Sidewalls 204, 205 both pinch inwards as they move from the bottom of the trench to the top of the trench. In an embodiment the trench has a high aspect ratio based on the ratio of height 208 to width (whereas the width may be 207', 207", or an average of 207' and 207"). An embodiment concerns a trench with an aspect ratio of 2.0 (a "high aspect ratio structure") but other embodiments may operate with aspect ratios such as 1.5, 1.7, 1.9, 2.1, 2.3, 2.5 or higher.

Figure 2B:
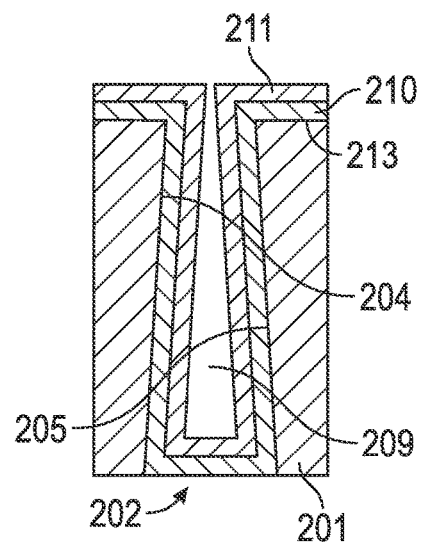

In FIG. 2B a first ALD layer 210 is conformally deposited on the bottom of trench 202, sidewalls 204, 205, and on the top surface 213 of dielectric 201. Afterwards a second ALD layer 211 is formed on layer 210.

Figure 2C:
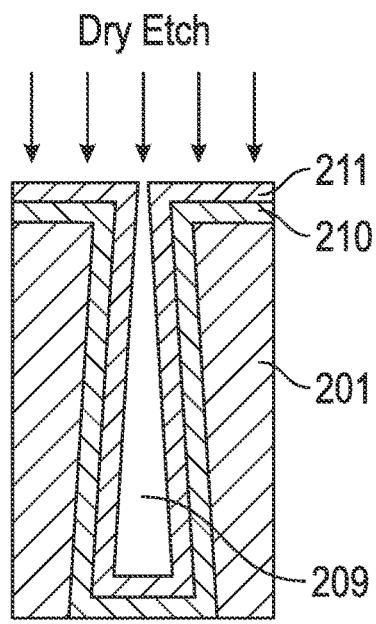
Figure 2D:
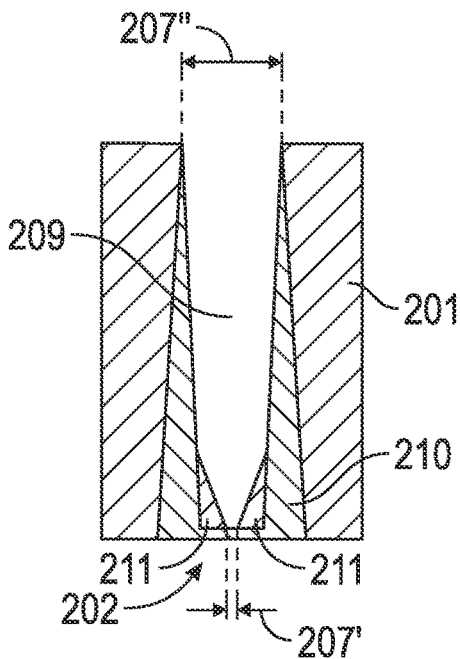

In FIG. 2C a selective dry etch is used on the two ALD layer film (including layers 210, 211). Bottom ALD film 210 has a lower dry etch rate than the dry etch rate for layer 211. Film 210 operates as an etch stop layer. As a result void 209, which was top tapered in FIG. 2B after deposition of layers 210, 211 is now transformed to a bottom tapered void where the minimum void width 207' at the bottom of trench 202 is now less than the width 207". The newly reformed void is now "V shaped". As seen in FIG. 2D remnants of layer 211 may still exist but in other embodiments layer 211 is completely removed by the dry etch. As used herein, "selective dry etch" means the ability to etch a first film (e.g., film 211) at a faster rate than a second film (e.g., film 210) but with a non-zero etch rate for the second film (e.g., film 210). This would allow for removing the top corners of the second film (e.g., film 210). While this "corner" removal is not necessarily shown in FIG. 2D embodiments may leave film 210 extending along the entire side wall 204, 205 or along various portions thereof (e.g., extending from the bottom of sidewall 204 to about 80% upwards along the height of sidewall 204).

Figure 2E:
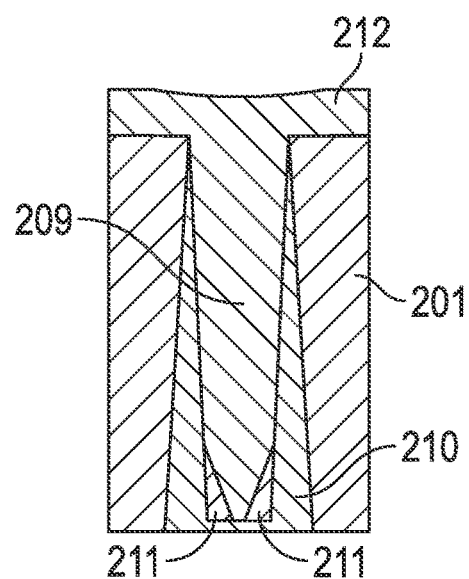

In FIG. 2E an additional ALD film layer 212 is deposited within the V-shaped trench to obtain a seam/void free fill and an interconnect that is less likely to have contaminants that lead to shorting and higher resistance values due to voids/seams. The ALD film 212 chemistry is selected based on the desired properties (dry etch rates/wet etch rates) of the process requirement.

Thus, trenches with a wider top (V-shaped) are more conducive to ALD trench filling than other scenarios (e.g., vertical walls or top-tapered trenches) and the embodiments described above help promote this trench configuration. Further, such a multilayer ALD based interconnect helps achieve robust gap filling of interconnect structures at small scales such as 22 nm, 14 nm, 10 nm and beyond. Further, in an embodiment we note that this technique of partially filling trenches (209), using a sacrificial film (211), and etching to promote a desirable shape for the subsequent film deposit may be repeated if necessary to complete filling the trench.

Figure 3:
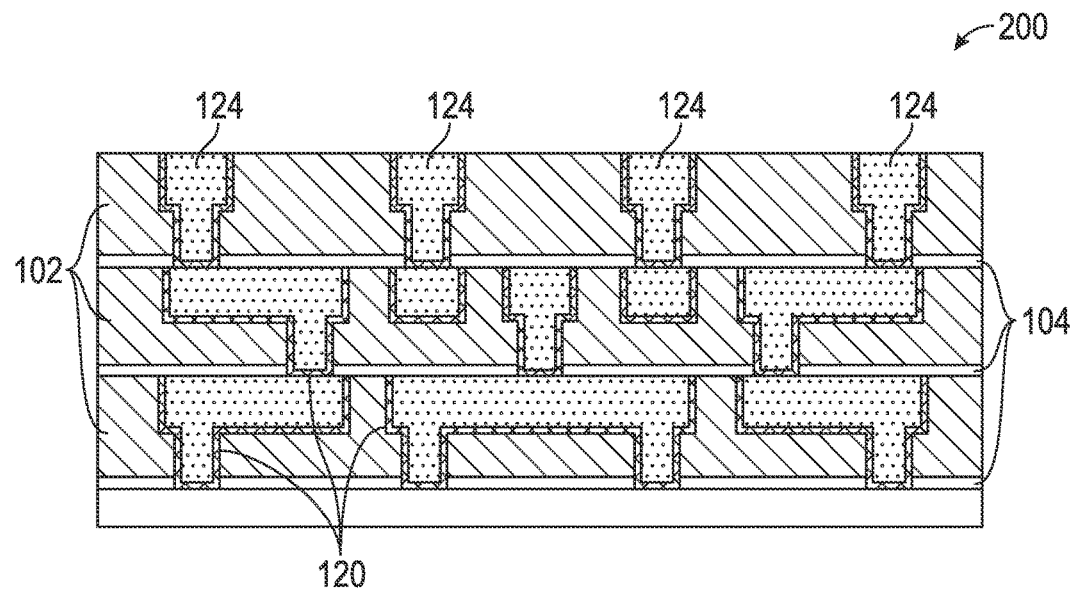
FIG. 3 is a cross-sectional side view of a back end in an embodiment of the present invention.

FIG. 3 illustrates a cross-section 200 of a portion of an IC structure with metal interconnects according to an embodiment of the present invention. A stack of dielectric layers 102 includes metal interconnects having ALD layers (collectively shown as layers 120) and fill layers 124. The ALD layers 120 are greatly simplified and do not show the tapering and other details better described in FIGS. 2A-E. The portion of the IC structure shown in FIG. 2 can be a portion of a back end of line (BEOL) metallization structure as found, for example, in a microprocessor die or memory die.

Figure 4:
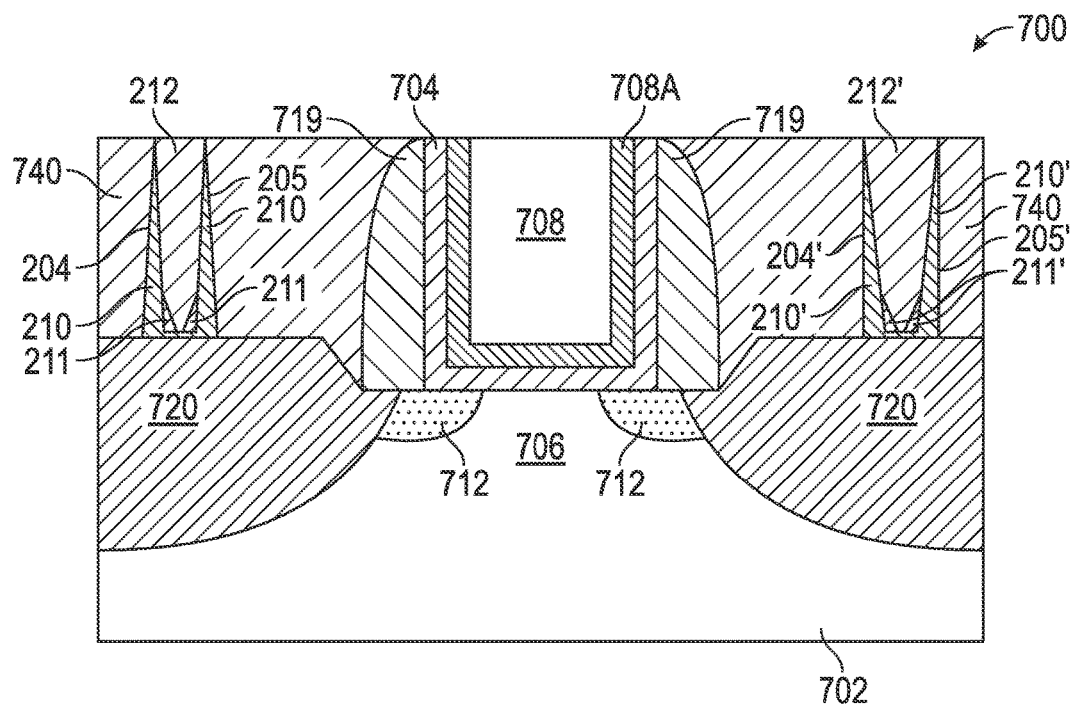
FIG. 4 depicts a semiconductor field effect transistor (FET) including a metal gate electrode and source/drain contacts, in accordance with an embodiment of the present invention.

In an example, FIG. 4 depicts a metal oxide semiconductor field effect transistor (MOS-FET) 700 fabricated on a substrate 702, in accordance with an embodiment of the present invention. A gate dielectric layer 704 is disposed above a channel region 706, and a gate electrode 708 is disposed above gate dielectric layer 704. Gate dielectric layer 704 and gate electrode 708 may be isolated by gate isolation spacers 710. Tip extensions 712 may be formed by implanting dopant atoms into substrate 702. Source and drain regions (e.g., strain-inducing source/drain regions 720) may be formed by selectively growing an epitaxial film in etched-out portions of substrate 702 and are doped either in situ or after epitaxial film growth, or both. In an embodiment tip extensions 712 may be formed simultaneously with the source and drain regions to create "epi" tip extensions. In typical MOS-FETs, the channel region 706 is composed of a semiconductor material, such as single crystalline silicon. In an embodiment, the gate electrode 708 is a metal gate electrode (e.g., the work function of the gate electrode 708 is based on a metal or metal-containing layer).

In an embodiment an interconnect structure may be included wherein the interconnect opening has opening sidewalls 204, 205 that expose a conductive region of substrate such as the source or drain 720. The structure also includes a first layer 210 on the conductive region 720 and the opening sidewalls 204, 205. A second ALD layer 212 is on a portion of the first ALD layer 210, and a third ALD layer 211 is within the opening and on the first ALD layer 210. As shown in FIG. 4 some sidewalls may be tapered (204, 205) while others (204', 205') may not be tapered or tapered with a different profile or magnitude of taper. Also, in some embodiments layer 212 may directly contact the conductive layer (e.g., source or drain). In other words, the layer 210 may not necessarily extend between all portions of layer 212 and conductive portion 720.

In addition, while not shown herein in great detail gate electrode 708 may be formed in the same manner as either interconnect that is coupled to source/drain regions 720. Portion 708A may constitute a layer analogous to layer 210 of FIG. 2D and include varying levels of bottom tapering as described above.

Also, it is to be understood that the MOS-FET 700 may be a planar device or include a three-dimensional body (e.g., as in a double-gate, fin-fet, tri-gate, or gate-all-around transistor). As such, the substrate 702 may be a planar substrate or depict a cross-sectional view of a three-dimensional body. Finally, it is to be understood that only several features of the MOS-FET 700 are depicted for clarity. It is to be understood that isolation layers, e.g., interlayer dielectric layer 740, and metallization routing layers used for integrating MOS-FET 700 into, e.g., an integrated circuit may also be included, as is well known in the art.

In an embodiment, conductive region 720 includes at least some germanium (e.g., an exposed doped silicon germanium or doped germanium region, or a metal germanide region). In an embodiment, conductive region 720 includes at least some silicon (e.g., an exposed doped silicon region, or a metal silicide region (not shown)).

Figure 5:
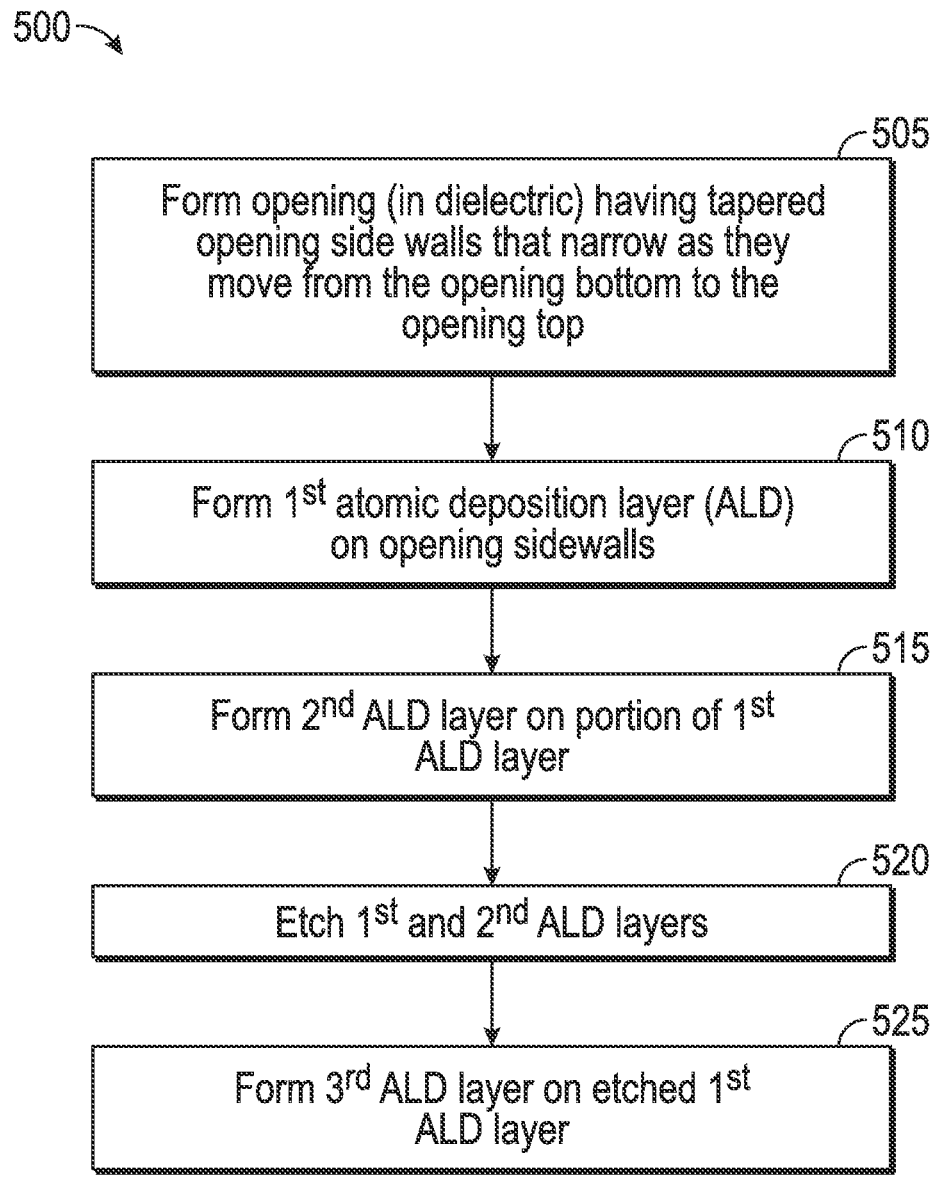
FIG. 5 is a flow chart illustrating a method of forming interconnects according to an embodiment of the present invention.

FIG. 5 is a flow chart illustrating a method 500 of forming interconnects according to an embodiment of the present invention. Block 505 includes forming an opening in a dielectric layer on a substrate, wherein the opening has opening sidewalls and exposes a conductive region of at least one of the substrate and an additional interconnect structure. Block 510 includes forming a first ALD layer on the conductive region (optional) and the opening sidewalls. Block 515 includes forming a second ALD layer on a portion of the first ALD layer. Block 520 includes etching the first and second ALD layers. Block 525 includes forming a third ALD layer within the opening and on the first ALD layer.

While layers 210, 211, 212 are described herein as ALD layers, any one or all of these layers may be deposited using other conformal deposition techniques such as chemical vapor deposition (CVD), physical vapor deposition (PVD), electroplating, electroless plating or other suitable process that deposits conformal thin films. As used herein, these conformal deposition techniques (e.g., ALD, CVD, PVD, e-beam evaporation, electroplating, electroless plating, and the like) are referred to herein as "thin film" deposition techniques that deposit "thin films" that are conformal. Thus, for example, while FIG. 5 uses ALD other embodiments may practice the process of FIG. 5 but with other conformal deposition techniques.

Although embodiments may be ideally suited for fabricating semiconductor ICs such as, but not limited to, microprocessors, memories, charge-coupled devices (CCDs), system on chip (SoC) ICs, or baseband processors, other applications can also include microelectronic machines, MEMS, lasers, optical devices, packaging layers, and the like. Embodiments may also be used to fabricate individual semiconductor devices (e.g., an interconnect structure described herein may be used to fabricate a gate electrode of a MOS transistor).

In an embodiment the dielectric layer (e.g., layer 201) may be composed of any suitable dielectric or insulating material such as, but not limited to, silicon dioxide, SiOF, carbon-doped oxide, a glass or polymer material, and the like.

Further, embodiments such as the embodiment of FIG. 2A depict an interconnect having a single opening with tapered sidewalls. Such an opening may be formed using a damascene process. However, in other embodiments an opening having a stepped sidewall (such as a trench formed directly over a via), as is common in a dual damascene process, may be used. The opening or openings may be fabricated in dielectric layer 201 by well known lithography and etch processing techniques typically used in damascene and dual damascene type fabrication. Although only a single dielectric layer 201 is depicted, multiple layers of the same or differing dielectric materials may instead be used (e.g., a dielectric layer including an opening for a line formed over another dielectric layer having a via). Additionally, in an embodiment the dielectric layer 201 is formed on an etch stop layer (not shown) disposed on substrate (e.g., substrate 702 of FIG. 4). The etch stop layer may be composed of a material such as silicon nitride or silicon oxynitride.

In an embodiment, ALD layers 210, 211 are deposited to form a high quality conformal layer that sufficiently and evenly covers all exposed surfaces within the openings and top surfaces. The ALD layers may be formed, in one embodiment, by depositing the ALD layers at a slow deposition rate to evenly and consistently deposit the conformal adhesion layer.

Deposition recipes of thin films using processes such as CVD, ALD, and PVD may vary depending on the desired process time, thickness, and quality of conformity. For example, utilizing CVD to deposit any of ALD layers 210, 211, 212 may create a conformal thin film layer more quickly than it would take an ALD process to deposit the same layer; however, the quality of the thin film deposited by the CVD process may be lower than the quality of the thin film deposited by the ALD process. In another embodiment, any or all of layers 210, 211, 212 are deposited by a PVD process. The PVD process may be performed with an increased distance between the receiving substrate and the corresponding sputter target to form a highly conformal thin film.

Layer 212 may be formed on the exposed surfaces of layers 210, 211, such that the fill material or layer 212 completely fills the opening 209 and is formed on the top surface 213 of the dielectric 201 and/or any portion of layer 210 that is on surface 213.

In one embodiment, the process method used to form the fill material 212 may be different than the process used to form either of layers 210, 211. Furthermore, either or both of layers 210, 211 may be formed conformally, while the fill material 212 may be formed in a non-conformal or bottom up approach. For example, the layers 210, 211 may be formed by an ALD deposition process that forms a conformal layer on exposed surfaces of the receiving substrate, while the fill material 212 may be formed by a PVD process that directionally sputters the fill material onto the surfaces of the layers 210, 211, with greater deposition rates on flat surfaces as opposed to on sidewall surfaces. In another example, the layers 210, 211 may be formed by an ALD deposition process that forms a conformal layer on exposed surfaces of the opening, while the fill material 212 may be formed by an electroplating process that grows the fill material from the surfaces of the ALD layers 210, 211. In yet another example, the layers 210, 211 may be formed by a CVD deposition process and the fill material 212 may be formed by a PVD process.

In another embodiment, the layers 210, 211 and the fill material 212 may be deposited by the same process (e.g. ALD, CVD, or PVD) but with different sets of deposition parameters, such as pressure, deposition rate, temperature, and the like. For example, the layers 210, 211 may be deposited by an ALD process; however, the set of parameters used in the ALD processing for the adhesion layer 120, such as deposition pressure and temperature, may be different than the set of parameters used in the CVD processing for the fill material 212. In another example, the layer 210 and the fill material 212 are formed by a PVD process, but the layer 211 may be formed by a PVD process with a larger distance between the target and the receiving substrate than the PVD process used to form the fill material 212. In another embodiment, the metal fill material 212 is formed by a columnated PVD process, while the layers 210, 211 are formed by a non-columnated PVD process. Or alternatively, the layers 210, 211 are formed by an ALD process with a lower deposition rate than the deposition rate of the ALD process used to form the fill material 212 such that the layers 210, 211 are formed more conformally than the fill material 212.

An anneal process may optionally be performed to reflow the deposited interconnect layer. Any seam that is still present in the interconnect structure may be removed subsequent to the anneal process, forming a solid structure within opening 202 and dielectric layer 201. The anneal process may help grow larger grain structures within the fill material 212, decreasing resistivity and expelling impurities from poor grain structures. In one embodiment, the anneal process uses gasses such as nitrogen, hydrogen, and argon. Furthermore, the anneal process may be performed at a temperature less than the thermal budget of the backend structures. For example, in one embodiment, the anneal process is performed at a temperature of 300° C. to 400° C. In another embodiment, the anneal process is performed at a temperature that is higher than the melting point of fill material 212 but lower than the thermal budget of the backend structures.

In yet another embodiment, a cycling technique may optionally be utilized to deposit the interconnect layer 212 (also referred to as fill layer 212) within the opening 209 without a seam. One cycle may involve one deposition of the fill material 212 and one anneal process. The anneal operation of one cycle may be set at a temperature and time duration to briefly reflow the fill material to improve step coverage. The deposition operation of one cycle may be a short deposition to deposit less fill material, such that several operations are required to completely fill the opening 209. In one embodiment, less than 5 cycles are needed to deposit the fill material 212 without a seam.

A chemical mechanical planarization (CMP) process may be performed to remove the fill material 212 and any leftover ALD layer 210, 211 disposed above the top surface 213 of the dielectric layer 201. In one embodiment, the CMP process may be a timed CMP process that is timed to stop at the top surface 213 of the line dielectric layer. In another embodiment, the CMP process may utilize the top surface 213 of the line dielectric layer as a stopping layer. Because the thickness of the fill material deposited above the top surface of the line dielectric layer may vary, utilizing the top surface 213 as a stopping layer may be a more reliable method. In an alternative embodiment, an etch process is used to remove the fill material 212 above the top surface 213 of the dielectric layer 102.

Various embodiments may be included in, for example, a mobile computing node such as a cellular phone, Smartphone, tablet, Ultrabook®, notebook, laptop, personal digital assistant, and mobile processor based platform.

Example 1 includes A metal interconnect structure, comprising: a dielectric layer on a substrate; an opening in the dielectric layer, wherein the opening has opening sidewalls and exposes a conductive region of at least one of the substrate and an additional interconnect structure; a first conformal thin film layer (first layer) on the conductive region and the opening sidewalls; a second conformal thin film layer (second layer) on a portion of the first layer, and a third conformal thin film layer (third layer) within the opening and on the first layer. In an embodiment the additional interconnect structure may include a via, a trench filled with metal (interconnect line), and the like.

In example 2 the subject matter of the Example 1 can optionally include wherein the third layer is on the second layer.

In example 3 the subject matter of the Examples 1-2 can optionally include wherein the third layer directly contacts the first and second layers.

In example 4 the subject matter of the Examples 1-3 can optionally include wherein the first and second layers include different material compositions.

In example 5 the subject matter of the Examples 1-4 can optionally include wherein the first and third layers include equivalent material compositions.

In example 6 the subject matter of the Examples 1-5 can optionally include wherein each of the first, second, and third layers is formed using at least one of atomic layer deposition (ALD), chemical vapor deposition (CVD), physical vapor deposition (PVD), electroplating, electroless plating, and e-beam evaporation.

In example 7 the subject matter of the Examples 1-6 can optionally include wherein the first layer is more thickly formed near a bottom of the opening than near a top of the opening.

In example 8 the subject matter of the Examples 1-7 can optionally include wherein the second layer is more thickly formed near the bottom of the opening than near the top of the opening.

In example 9 the subject matter of the Examples 1-8 can optionally include wherein the opening is narrower at its top than at its bottom.

In example 10 the subject matter of the Examples 1-9 can optionally include wherein the opening has (a) an opening height from a top of the opening to a bottom of the opening and an opening width at the bottom of the opening, and (b) an aspect ratio (the opening height:the opening width) of at least 1.7.

In example 11 the subject matter of the Examples 1-10 can optionally include wherein: the first layer includes a first material selected from the group comprising silicon oxide, silicon nitride, silicon oxyfluoride, silicon oxynitride, tantalum, tantalum nitride, titanium, titanium nitride, aluminum, and copper; the second layer includes a second material, including a different chemical element from the first material, selected from the group comprising silicon oxide, silicon nitride, silicon oxyfluoride, silicon oxynitride, tantalum, tantalum nitride, titanium, titanium nitride, aluminum, and copper; and the third layer includes a third material selected from the group comprising silicon oxide, silicon nitride, silicon oxyfluoride, silicon oxynitride, a tantalum, tantalum nitride, titanium, titanium nitride, aluminum, and copper. In an embodiment the first, second, and/or third layers may include a dielectric not listed immediately above. The second layer may include an insulator or metal different from the first layer material having a different etch rate from the first layer. The third layer may include an insulator or metal with similar properties to the first layer in some embodiments but not necessarily so in other embodiments.

In example 12 the subject matter of the Examples 1-11 can optionally include wherein the first layer directly contacts the second layer.

In example 13 the subject matter of the Examples 1-12 can optionally include wherein at least one of (a) the first layer forms first layer sidewalls that taper inwards towards a bottom of the opening, and (b) the second layer forms second layer sidewalls that taper inwards towards the bottom of the opening.

In example 14 the subject matter of the Examples 1-13 can optionally include wherein the opening sidewalls taper inwards towards a top of the opening.

In example 15 the subject matter of the Examples 1-14 can optionally include wherein the first and second layers are collectively no thicker than 50% of a minimum width of the opening.

In example 16 the subject matter of the Examples 1-15 can optionally include wherein the first layer directly contacts the conductive region and the dielectric layer.

Example 17 includes a method of forming a metal interconnect structure, comprising: forming an opening in a dielectric layer on a substrate, wherein the opening has opening sidewalls and exposes a conductive region of at least one of the substrate and an additional interconnect structure; forming a first conformal thin film layer (first layer) on the conductive region and the opening sidewalls; forming a second conformal thin film layer (second layer) on a portion of the first layer; etching the first and second layers; and forming a third conformal thin film layer (third layer) within the opening and on the etched first layer.

In example 18 the subject matter of Example 17 can optionally include wherein the third layer directly contacts the first and second layers.

In example 19 the subject matter of the Examples 17-18 can optionally include wherein the first and second layers include different material compositions.

In example 20 the subject matter of the Examples 17-19 can optionally include wherein the opening sidewalls taper inwards near a top of the opening and at least one of (a) the first layer forms first layer sidewalls that taper inwards towards a bottom of the opening, and (b) the second layer forms second layer sidewalls that taper inwards towards the bottom of the opening.

In example 21 the subject matter of the Examples 17-20 can optionally include wherein etching the first and second layers includes simultaneously etching the first and second layers at different etch rates wherein the first layer is etched more slowly than the second layer.

Example 22 includes an semiconductor structure, comprising: a dielectric layer on a substrate; an opening in the dielectric layer, wherein the opening has opening sidewalls; a first conformal deposition layer (first layer) on the opening sidewalls; a second conformal deposition layer (second layer) on a portion of the first layer, and a third conformal deposition layer (third layer) within the opening and directly contacting the first and second layers.

In example 23 the subject matter of the Example 22 can optionally include wherein the third layer directly contacts the first and second layers and the first layer includes an atomic layer deposition (ALD) layer, chemical vapor deposition (CVD) layer, physical vapor deposition (PVD) layer, electroplated layer, electroless plated layer, and e-beam evaporation layer and the semiconductor structure includes at least one of a metal interconnect, a transistor gate, and a trench contact.

In example 24 the subject matter of the Examples 22-23 can optionally include wherein the first and second layers include different material compositions.

In example 25 the subject matter of the Examples 22-24 can optionally include wherein the opening sidewalls taper inwards near a top of the opening and at least one of (a) the first layer forms first layer sidewalls that taper inwards towards a bottom of the opening, and (b) the second layer forms second layer sidewalls that taper inwards towards the bottom of the opening.

The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A metal interconnect structure, comprising:
   a dielectric layer on a substrate;
   an opening in the dielectric layer, wherein the opening has opening sidewalls and exposes a conductive region of at least one of the substrate and an additional interconnect structure;
   a first conformal thin film layer (first layer) on the conductive region and the opening sidewalls;
   a second conformal thin film layer (second layer) within the opening and on a portion of the first layer, and
   a third conformal thin film layer (third layer) within the opening and on the first layer;
   wherein (a) the third layer directly contacts the first and second layers, (b) the opening sidewalls continuously taper inward along each of a bottom, a middle, and a top of the opening so that the opening is narrower at its top than at its bottom, and (c) a horizontal axis, parallel to the substrate, intersects a second layer sidewall portion that tapers outward and an opening sidewall portion that tapers inward.

2. The structure of claim 1, wherein the first and second layers include different material compositions.

3. The structure of claim 1, wherein:
   the first layer includes a first material having a first etch rate; and
   the second layer includes a second material having a second etch rate that is faster than the first etch rate.

4. The structure of claim 3, wherein the first and third layers include equivalent material compositions.

5. The structure of claim 3, wherein each of the first, second, and third layers is formed using at least one of atomic layer deposition (ALD), chemical vapor deposition (CVD), physical vapor deposition (PVD), electroplating, electroless plating, and e-beam evaporation.

6. The structure of claim 5, wherein the first layer is more thickly formed near the bottom of the opening than near the top of the opening.

7. The structure of claim 6, wherein the second layer is more thickly formed near the bottom of the opening than near the top of the opening.

8. The structure of claim 1, wherein the opening has (a) an opening height from a top of the opening to a bottom of the opening and an opening width at the bottom of the opening, and (b) an aspect ratio (the opening height:the opening width) of at least 1.7.

9. The structure of claim 3, wherein:
   the first material is selected from the group comprising silicon oxide, silicon nitride, silicon oxyfluoride, silicon oxynitride, tantalum, tantalum nitride, titanium, and titanium nitride;
   the second material, including a different chemical element from the first material, is selected from the group comprising silicon oxide, silicon nitride, silicon oxyfluoride, silicon oxynitride, tantalum, tantalum nitride, titanium, titanium nitride, aluminum, and copper; and
   the third layer includes a third material selected from the group comprising silicon oxide, silicon nitride, silicon oxyfluoride, silicon oxynitride, a tantalum, tantalum nitride, titanium, titanium nitride, aluminum, and copper.

10. The structure of claim 1, wherein at least one of (a) the first layer forms first layer sidewalls that taper inwards towards the bottom of the opening, and (b) the second layer forms second layer sidewalls that taper inwards towards the bottom of the opening.

11. The structure of claim 1, wherein the first and second layers are collectively no thicker than 50% of a minimum width of the opening.

12. The structure of claim 1, wherein the first layer directly contacts the conductive region and the dielectric layer.

13. The structure of claim 1, wherein the opening having opening sidewalls and exposing the conductive region of at least one of the substrate and the additional interconnect structure comprises the opening sidewalls directly contacting the conductive region and the opening including no bottom wall to separate the conductive region from the opening.

14. The structure of claim 12, wherein the third layer directly contacts the conductive region of the substrate.

15. The structure of claim 1, wherein the first layer directly contacts the conductive region of the substrate.

16. The structure of claim 1, wherein a middle portion of each of the opening sidewalls directly contacts the dielectric layer.

17. The structure of claim 16, wherein the opening directly interfaces the conductive region of the substrate.

18. An semiconductor structure, comprising:
   a dielectric layer on a substrate;
   an opening in the dielectric layer, wherein the opening has opening sidewalls;
   a first conformal deposition layer (first layer) on the opening sidewalls;
   a second conformal deposition layer (second layer) on a portion of the first layer, and
   a third conformal deposition layer (third layer) within the opening and directly contacting the first and second layers;
   wherein a horizontal axis, which is parallel to the substrate, intersects (a) a portion of the opening sidewalls that taper inward moving away from the substrate, and (b) a portion of second layer sidewalls that taper outward moving away from the substrate.

19. The structure of claim 18 wherein the first layer includes at least one of an atomic layer deposition (ALD) layer, chemical vapor deposition (CVD) layer, physical vapor deposition (PVD) layer, electroplated layer, electroless plated layer, and e-beam evaporation layer and the semiconductor structure includes at least one of a metal interconnect, a transistor gate, and a trench contact.

20. The structure of claim 19, wherein:
   the first layer includes a first material having a first etch rate; and
   the second layer includes a second material having a second etch rate that is faster than the first etch rate.

21. A semiconductor structure, comprising:
   a dielectric layer on a substrate;
   an opening in the dielectric layer, wherein the opening has opening sidewalls;
   a first conformal deposition layer (first layer) on the opening sidewalls;
   a second conformal deposition layer (second layer) on a portion of the first layer, and a third conformal deposition layer (third layer): (a)(i) within the opening, (a)(ii) directly contacting the first layer at a location within the opening, and (a)(iii) directly contacting the second layer at another location within the opening;

wherein the first layer: (b)(i) directly contacts a conductive region and the dielectric layer, and (b)(ii) is an etch stop layer.

22. The structure of claim 21 wherein:

the first layer includes at least one of an atomic layer deposition (ALD) layer, chemical vapor deposition (CVD) layer, physical vapor deposition (PVD) layer, electroplated layer, electroless plated layer, and e-beam evaporation layer;

the first layer includes a first material selected from the group comprising silicon oxide, silicon nitride, silicon oxyfluoride, silicon oxynitride; and the semiconductor structure includes at least one of a metal interconnect, a transistor gate, and a trench contact.

23. The structure of claim 22, wherein the opening sidewalls taper inwards near a top of the opening and at least one of (a) the first layer forms first layer sidewalls that taper inwards towards a bottom of the opening, and (b) the second layer forms second layer sidewalls that taper inwards towards the bottom of the opening.

24. The structure of claim 22, wherein the opening is narrower at its top than at its bottom.

25. The structure of claim 23, wherein:

the first layer includes a first material having a first etch rate; and the second layer includes a second material having a second etch rate that is faster than the first etch rate.

* * * * *